United States Patent
Reid

(10) Patent No.: US 8,907,390 B2
(45) Date of Patent: Dec. 9, 2014

(54) MAGNETIC TUNNEL JUNCTION STRUCTURE

(75) Inventor: Jason Reid, San Jose, CA (US)

(73) Assignee: Crocus Technology Inc., Santa Clara, CA (US)

( * ) Notice: Subject to any disclaimer, the term of this patent is extended or adjusted under 35 U.S.C. 154(b) by 1064 days.

(21) Appl. No.: 12/944,663

(22) Filed: Nov. 11, 2010

(65) Prior Publication Data

US 2011/0108937 A1    May 12, 2011

Related U.S. Application Data

(60) Provisional application No. 61/260,527, filed on Nov. 12, 2009.

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01F 10/32 | (2006.01) | |
| G11C 11/16 | (2006.01) | |
| B82Y 25/00 | (2011.01) | |
| H01L 43/08 | (2006.01) | |

(52) U.S. Cl.
CPC ............ *G11C 11/16* (2013.01); *H01F 10/3254* (2013.01); *B82Y 25/00* (2013.01); *H01L 43/08* (2013.01)

USPC .... 257/295; 257/321; 257/633; 257/E21.006; 257/E21.077; 257/E21.085; 257/E21.129; 257/E21.208; 257/E21.253; 257/E21.499

(58) Field of Classification Search
USPC .......... 257/295, 200, 201, 321, 322, 421, 425, 257/487, 663, 930
See application file for complete search history.

(56) References Cited

U.S. PATENT DOCUMENTS

| | | | |
|---|---|---|---|
| 7,006,375 B2 * | 2/2006 | Covington | .................. 365/173 |
| 7,411,817 B2 | 8/2008 | Nozieres et al. | |
| 8,208,295 B2 * | 6/2012 | Dieny | .......................... 365/171 |
| 8,273,582 B2 * | 9/2012 | Nozieres et al. | ................. 438/3 |
| 8,409,880 B2 * | 4/2013 | Nozieres et al. | ................. 438/3 |
| 8,652,856 B2 * | 2/2014 | Nozieres et al. | ................. 438/3 |
| 2007/0263434 A1 | 11/2007 | Dieny et al. | |

* cited by examiner

*Primary Examiner* — David Nhu
(74) *Attorney, Agent, or Firm* — Cooley LLP

(57) ABSTRACT

Disclosed herein is a thermally-assisted magnetic tunnel junction structure including a thermal barrier. The thermal barrier is composed of a cermet material in a disordered form such that the thermal barrier has a low thermal conductivity and a high electric conductivity. Compared to conventional magnetic tunnel junction structures, the disclosed structure can be switched faster and has improved compatibility with standard semiconductor fabrication processes.

39 Claims, 2 Drawing Sheets

MAGNETIC TUNNEL JUNCTION STRUCTURE

CROSS-REFERENCE TO RELATED APPLICATION

This application claims the benefit of U.S. Provisional Application No. 61/260,527, filed on Nov. 12, 2009, the disclosure of which is hereby incorporated herein by reference in its entirety for all purposes.

FIELD OF THE INVENTION

The technical field of this disclosure relates to magnetic tunnel junction structures, and particularly to thermally-assisted magnetic tunnel junction structures, and more particularly to thermally-assisted magnetic tunnel junction structures used as memories capable of storing digital signals, analog signals, or both.

BACKGROUND

A magnetic tunnel junction structure includes two magnetic thin-films separated by an ultra-thin layer of an insulator. The insulating layer is sufficiently thin, typically with a thickness of around 1 nanometer, such that electrons can tunnel through the insulating layer (also referred to as a tunnel barrier) if a bias voltage is applied across the two magnetic thin-films. The tunneling current depends upon the relative orientation of magnetizations of the two magnetic thin-films, while the orientation can be altered by an applied magnetic field.

Extensive interest exists in magnetic tunnel junction structures due to their usefulness in both industrial applications and scientific research. In particular, significant studies have been undertaken on the application of magnetic tunnel junction structures for storage (e.g., digital signal memories) and sensors (e.g., analog signal sensors).

A thermally-assisted magnetic tunnel junction structure is a type of magnetic tunnel junction structure. A thermally-assisted magnetic tunnel junction structure employs an electrically conducting but thermally-resistive thin-film (also referred to as a "thermal film") in the structure to achieve a Curie temperature in one of the magnetic layers using a reduced electric heating current during operation.

For the purpose of achieving a Curie temperature for a magnetic layer within a device, a thermal layer in a thermally-assisted magnetic tunnel junction structure desirably has a high electric conductivity and a low thermal conductivity (e.g., with respect to transition metals). Existing thermally-assisted magnetic tunnel junction structures can use materials such as Ge—Sb—Te alloys. Integration of such materials, however, is difficult due to deleterious thermal and mechanical properties as well as the unusual ease in which such materials are etched in fabrication.

It is against this background that a need arose to develop the magnetic tunnel junction structures described herein.

SUMMARY

In view of the foregoing, disclosed herein is a thermal layer for use in thermally-assisted magnetic tunnel junction structures, such as thermally-assisted magnetic tunnel junction structures for use as memories.

In one embodiment, a magnetic random access memory device includes: a magnetic tunnel junction including a tunnel junction layer positioned between first and second magnetic layers; and a thermal barrier layer that includes a material having the formula $X_aY_bZ_c$, wherein X is a transition metal, Y is an element selected from Group IIIA and Group IVA, and wherein Z is an element selected from Group VA and Group VIA.

In another embodiment, a magnetic random access memory device includes: a magnetic tunnel junction including a fixed magnetic layer, a free magnetic layer, a magnetic tunnel junction layer, and a thermal barrier that includes a varistor having a non-linear current-voltage property.

In yet another embodiment, a thermally-assisted magnetic tunnel junction structure includes: a magnetic tunnel junction; and a thermal barrier attached to the magnetic tunnel junction, wherein the thermal barrier has a thermal conductivity of 3 W/mK or less and an electric resistivity of 200 μΩ-cm or more at a temperature of 20° C.

In yet another embodiment, a structure includes: a magnetic tunnel junction; and a thermal barrier attached to the magnetic tunnel junction, wherein the thermal barrier includes a cermet material that includes a ceramic component and a metallic component, and the metallic component has a long-range order that is 100 angstroms or less in the thermal barrier.

In yet another embodiment, a thermally-assisted magnetic tunnel junction structure includes: a magnetic tunnel junction; and a thermal barrier in contact with the magnetic tunnel junction, wherein the thermal barrier has a long-range order that is 100 angstroms or less in the thermal barrier.

In yet another embodiment, a thermally-assisted magnetic random access memory device includes: a magnetic tunnel junction including a tunnel junction layer positioned between a free magnetic layer and a fixed magnetic layer; and a thermal barrier including a cermet material, and pinning the free magnetic layer below a temperature threshold and acting as a paramagnet at and above the temperature threshold when the thermal barrier is heated.

The present disclosure also pertains to a magnetic memory system including multiple thermally-assisted magnetic random access memory devices.

Some embodiments of the thermally-assisted magnetic tunnel junction structure disclosed herein have shorter heating and cooling cycles and thus can be switched faster than conventional magnetic tunnel junction structures. The disclosed thermal barrier is more compatible with standard semiconductor fabrication processes than existing materials used in conventional thermal barriers.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Disclosed herein is a thermally-assisted magnetic tunneling junction structure including a magnetic tunnel junction and at least one thermal barrier. The thermal barrier includes a varistor that exhibits a non-linear I-V (current-voltage) property, wherein the varistor in one embodiment can be a cermet that is composed of ceramic and metallic materials. The thermal barrier can be configured such that it exhibits a measurable negative thermal coefficient of resistivity (TCR). The thermal barrier can have a disordered structure that is composed of one or more electrically conductive components (also referred to as conductive component or components) and one or more electrically insulating or dielectric components (also referred to as dielectric component or components). The one or more electrically conductive components can be randomly distributed or distributed in a disorderly fashion, or can be embedded within a matrix of the one or more dielectric components. As a consequence, the thermal barrier can exhibit a low thermal conductivity (e.g., lower than the thermal conductivity of materials such as Ge—Sb—Te, or equal to or lower than about 3.0 W/m·K, such as equal to or lower than about 2.0 W/m·K) and a high electrical conductivity (e.g., equal to or higher than that of materials such as Ge—Sb—Te). In addition, the thermal barrier can be more compatible with standard semiconductor fabrication processes than existing materials when, for example, the thermal barrier is composed of a cermet.

Figure 1:
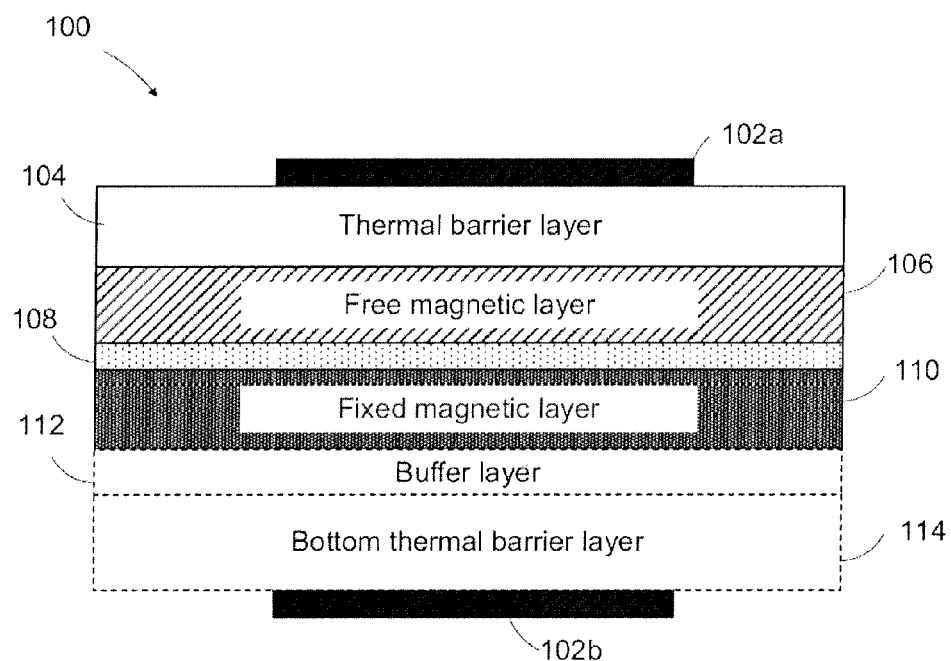
FIG. 1 diagrammatically illustrates an embodiment of a thermally-assisted magnetic tunnel junction structure.

Referring to the drawings, FIG. 1 diagrammatically illustrates an embodiment of a thermally-assisted magnetic tunnel junction structure 100. In this embodiment, the thermally-assisted magnetic tunnel junction structure 100 includes a magnetic tunnel junction that includes a free magnetic layer 106, a fixed magnetic layer 110, and a dielectric thin-film 108 positioned between the free magnetic layer 106 and the fixed magnetic layer 110. A thermal barrier 104 is provided for allowing the free magnetic layer 106 to be at a temperature suitable for reorienting the magnetization orientation of the free magnetic layer 106 with a reduced current during operation, such as a temperature substantially equal to or higher than a Curie temperature at or near the free magnetic layer 106 during operation. In the embodiment as diagrammatically illustrated in FIG. 1, the thermal barrier layer 104 is positioned adjacent to and in contact with the free magnetic layer 106. In other embodiments, a thermal barrier layer can be placed at other locations. For example, the thermal barrier layer 104 can be placed such that other functional members, such as electrode layer 102a, can be positioned between the thermal barrier layer 104 and the free magnetic layer 106.

The magnetic tunnel junction structure 100 (which includes the free magnetic layer 106, the dielectric layer 108, the fixed magnetic layer 110, and the thermal barrier layer 104) may include other functional members depending upon the desired functions. For example, another barrier layer 114 can be provided and placed adjacent to the bottom of the fixed magnetic layer 110 for preventing or reducing heat leakage from the fixed magnetic layer 110. A buffer layer 112 can also be provided between the fixed magnetic layer 110 and the bottom thermal barrier layer 114. A bottom electrode layer 102b can be positioned for electrical connection. The thermal barrier layer 104 and the bottom thermal barrier layer 114 can also be placed at various desired locations on the opposite side of the magnetic tunnel junction. For example, the bottom thermal barrier layer 114 can be placed such that other functional members, such as the bottom electrode layer 102b, can be positioned between the fixed magnetic layer 110 and the bottom thermal barrier layer 114.

Either one, or both, of the thermal barrier layers 104 and 114 can be composed of a varistor that exhibits a non-linear I-V property. In one embodiment, the thermal barrier layer 104 includes a cermet that is composed of ceramic and metallic materials. The thermal barrier layer 104 can be configured such that it exhibits a measurable negative thermal coefficient of resistivity (TCR). In a linear embodiment, the TCR can be expressed as $\Delta R/R_0 = \alpha \Delta T$, wherein R is the resistivity, $R_0$ is the reference resistivity, $\Delta R$ is the change of the resistivity due to the change of temperature $\Delta T$, and $\alpha$ is the TCR, which is negative. In a non-linear embodiment, the resistivity can also decrease with increasing temperature, albeit in accordance with a non-linear temperature dependence. The bottom thermal barrier layer 114 can be similarly configured.

Either one, or both, of the thermal barrier layers 104 and 114 can have a disordered structure that is composed of one or more conductive components and one or more dielectric components. The conductive component can be randomly distributed or distributed in a disorderly fashion, or can be embedded within a matrix of the dielectric component. As an example wherein the thermal barrier layer 104 is composed of one type of conductive component, such as a specific type of transition metal, the conductive component can be randomly or disorderedly distributed in a dielectric matrix, or otherwise distributed with a long range order (e.g., along the maximum dimension of the thermal barrier layer 104 such as its length) that is about 500 angstroms or less, such as about 400 angstroms or less, about 200 angstroms or less, about 100 angstroms or less, about 80 angstroms or less, about 70 angstroms or less, about 50 angstroms or less, or about 30 angstroms or less, and down to about 20 angstroms or less. In other examples wherein multiple types of conductive components are present and distributed in a matrix, the conductive components can be randomly or disorderedly distributed, or otherwise distributed such that the conductive components of the same type have a long range order that is about 500 angstroms or less, such as about 400 angstroms or less, about 200 angstroms or less, about 100 angstroms or less, about 80 angstroms or less, about 70 angstroms or less, about 50 angstroms or less, or about 30 angstroms or less, and down to about 20 angstroms or less. The bottom thermal barrier layer 114 can be similarly configured.

The disordered structure can be amorphous, a glass, a nanostructure, or a combination thereof, such as disordered matrices. Examples of disordered matrices can include matrix materials and nano-matrices. A matrix material can be composed of islands of materials interspersed in or at a surface of a base material. For example, a matrix material may be composed of islands of dielectric or conductive materials disorderedly or periodically positioned in a body or at a surface of a disordered base material. The islands can be of any phases, such as crystalline, amorphous, glass, or clusters with transition regions. A nano-matrix can be composed of a base material, within which nanoparticles are positioned. In one example, the base material may include vacancies within a body of the base material, and nanoparticles can be positioned within the vacancies. In another example, nanoparticles can be embedded within the body of the base material. In either example, the nanoparticles and the base material each can include dielectric and conductive materials.

For different structures and compositions, either one, or both, of the thermal barrier layers 104 and 114 can exhibit a low thermal conductivity and a high electric conductivity.

Specifically, the thermal barrier layer 104 can have a thermal conductivity that is from about 1.0 W/m·K to about 3.0 W/m·K, such as from about 1.0 W/m·K to about 2.0 W/m·K. In another example, the thermal barrier layer 104 can have a thermal conductivity that is equal to or less than about 3.0 W/m·K, such as about 2.0 W/m·K or less, about 1.0 W/m·K or less, about 0.5 W/mK or less, about 0.47 W/mK or less, about 0.28 W/mK or less, about 0.27 W/mK or less, or about 0.15 W/mK or less, and such as from about 0.05 W/mK to about 1.5 W/mK, from about 0.14 W/mK to about 0.27 W/mK, or from about 0.28 W/mK to about 0.47 W/mK. The bottom thermal barrier layer 114 can be similarly configured.

Either one, or both, of the thermal barrier layers 104 and 114 can have a heating or cooling time of about 10 ns or less, such as about 5 ns or less. The heating time in a thermally-assisted magnetic random access memory cell can be referred to as a time period for raising the temperature of a pinning layer (e.g., the thermal barrier layer 104 in FIG. 1) to a threshold temperature, such as its Neel temperature or its blocking temperature. It is understood that a pinning layer, such as the thermal barrier layer 104 in FIG. 1, in a thermally-assisted magnetic random access memory cell can be an anti-ferromagnetic layer and is thus used to pin the magnetization orientation of a free magnetic layer, such as the layer 106 in FIG. 1, to a desired magnetization orientation. The pining of the free magnetic layer helps to stabilize the state of the magnetic tunnel junction of the cell. However, such pinning can also make it more difficult to overcome the coercivity of the free magnetic layer (e.g., the layer 106 in FIG. 1) in order to switch its magnetization orientation. Accordingly, the pinning layer (e.g., the thermal barrier layer 104 in FIG. 1) is heated via an electrical current. The current flowing through the pinning layer is of sufficient magnitude to increase the temperature of the pinning layer to or above a certain threshold temperature, such as its Neel temperature or its blocking temperature, at which point the pinning layer (e.g., the thermal barrier layer 104) acts as a paramagnet. As a consequence, the pinning layer (e.g., the thermal barrier layer 104) will no longer pin the free magnetic layer 106 to its existing state, and a lower magnetic field can be sufficient to switch the magnetization orientation of the free magnetic layer 106. After updating the magnetization orientation of the free magnetic layer 106, the temperature of the pinning layer (e.g., the thermal barrier layer 104 in FIG. 1) is lowered to below its Neel temperature or below its blocking temperature so as to pin the updated magnetization orientation of the free magnetic layer 106. The time duration for such temperature-lowering process (e.g., to room temperature) can be referred to as the cooling time or annealing time. Shorter heating and cooling times are desired as, the shorter the heating and cooling times, the faster the magnetic tunnel junction switches its state, and, thus, the faster the cell operates. In another example, either one, or both, of the thermal barrier layers 104 and 114 can have a thermal conductivity that is substantially equal to or less than that of a Ge—Sb—Te thin-film layer of substantially the same thickness and operation conditions.

In order to pass through electrons, such as between the top electrode layer 102$a$ and the free magnetic layer 106 or between the bottom electrode layer 102$b$ and the fixed magnetic layer 110, a thermal barrier layer is expected to be electrically conductive. Specifically, either one, or both, of the thermal barrier layers 104 and 114 can exhibit an electrical conductivity from about $1\times10^4$ S/m to about $60\times10^4$ S/m at a temperature of 20° C., such as from about $1\times10^4$ S/m to about $10\times10^4$ S/m at a temperature of 20° C. A thermal barrier layer may have other electrical conductivities depending upon its specific structure and material. In one example, a thermal barrier layer may have an electrical conductivity of about $1\times10^4$ S/m or higher, such as about $10\times10^4$ S/m or higher or about $60\times10^4$ S/m or higher at a temperature of 20° C. In another example, a thermal barrier layer may have a thermal conductivity of about 3 W/mK or less and an electric resistivity of about 200 μΩ-cm or more at a temperature of 20° C. A thermal barrier layer may have a thermal conductivity of about 2 W/mK or less at a temperature of 20° C. and/or an electric resistivity of about 1000 μΩ-cm or more at a temperature of 20° C. In another example, a thermal barrier layer can have an electrical conductivity equal to or larger than that of a Ge—Sb—Te thin-film layer of substantially the same dimensions and operation conditions.

The coexistence of a low thermal conductivity and a sufficient electrical conductivity in a thermal barrier layer can be achieved by forming the thermal barrier layer as a varistor, such as a cermet material. Various cermet materials can be used for the thermal barrier layer. In one example, the cermet may be composed of transition metal nitrides, transition metal oxides, transition metal silicon-nitrides, transition metal boron-nitrides, or silicon-oxides of Ir, Ru, Re, Pd, Pt, or Rh, or any combinations thereof. In another example, the cermet may be composed of chalcogenides, metal-aluminum-nitrides, or noble metal-aluminum-nitrides. As used herein, transition metals are those elements in the periodic table in columns 3 to 12 (Group IB through Group VIIIB), namely columns beginning with Sc, Ti, V, Cr, Mn, Fe, Co, Ni, Cu, and Zn. Early transition metals are those elements in the periodic table in columns 3 to 7 (Group IIIB, Group IVB, Group VB, Group VIB, and Group VIIB), and late transition metals are those elements in columns 8 to 12 (Group VIIIB, Group IB, and Group IIB). As used herein, a "nitride" includes oxynitrides and carbonitrides, with additional oxygen or carbon desirably present, for example, in an amount of about 10 atomic % or less. Noble metals are those elements such as Ru, Rh, Pd, Ag, Os, Ir, Pt, and Au, and ferromagnetic transition metals include Fe, Co, and Ni.

In another embodiment, a thermal barrier layer is composed of a cermet that includes a matrix material. Specifically, the cermet is composed of a matrix base with interspersing particles (or islands, bubbles, or other forms) interspersed within or at a surface of the matrix base. The matrix base may be a binary compound Y-Z, where Y is selected from columns 13 to 16 (Groups IIIA to Group VIA) of the periodic table (e.g., Al, B, and/or Si), and Z is N. In this way, the matrix material can be a nitride of silicon, aluminum, or boron. The interspersed particles may be metallic materials that include a transition metal (preferably from Group VIIIB or Group IB of the periodic table) and that is desirably not bound to nitrogen, although bonding to nitrogen is also contemplated. The matrix base can alternatively be composed of $SiO_x$ (or $BO_x$, $PO_x$, $CO_x$, or $AlO_x$) with late transition metals (or early transition metals) interspersed within the matrix base (such as noble metals), although, at lower oxygen concentrations, a metal silicide phase may exist as well.

In yet another embodiment, a matrix material may be a ternary (or higher) material X-Y-Z, where X is a transition metal—such as a late transition metal; Y is Si, Al, or B; and Z is N (or O—N or C—N). Thus the material is viewed as including a nitride (or oxynitride or carbonitride) that forms an insulating matrix (e.g., silicon nitride, oxynitride, or carbonitride), with small "bubbles" or particles or islands of, for example, a late transition metal interspersed throughout the matrix base. In one example, the late transition metal is a noble metal. In another example, the late transition metal is Co, Ni, or Fe.

In yet another embodiment, either one, or both, of the thermal barrier layers 104 and 114 can include a material having the formula $X_aY_bZ_c$, wherein X is a transition metal (e.g., early transition metal or late transition metal, such as Ir, Ru, Re, Pd, Pt, Rh, Co, or Ti), Y is selected from column 13 or 14 (Group IIIA or Group IVA) in the periodic table (e.g., Si, B, Al, and Ge); and Z is selected from column 15 or 16 (Group VA or Group VIA) in the periodic table (e.g., N and O). In the formula $X_aY_bZ_c$, each of a, b, and c can be an integer or can take on a fractional value, and can range from, for example, about 0.01 to about 100, such as from about 0.5 to about 10, from about 0.5 to about 5, or from about 0.5 to about 3. Examples of the $X_aY_bZ_c$ material can be CoSiN and TiSiN.

In yet another embodiment, either one, or both, of the thermal barrier layers 104 and 114 can include an early transition metal nitride and another chemical element. Alternatively, either one, or both, of the thermal barrier layers 104 and 114 can include a noble metal and oxygen, or can include a conductive metal oxide and a third element, such as Si or O. In other examples, different transition metals can be included in at least one of the thermal barriers 104 and 114.

It is noted that the above materials for the matrix base and the interspersing particles can be used as cermet materials for the thermal barriers 104 and 114 but in any other forms other than a matrix with interspersing particles. The above materials can be presented as chemical composites or other forms in the thermal barriers 104 and 114.

A thin-film layer of the above discussed cermet can be formed in various thin-film deposition techniques, such as physical-vapor-deposition (PVD), chemical-vapor-phase deposition (CVD), plasma-enhanced-CVD (PECVD), low-pressure-CVD (LPCVD), and other methods. As an example, a transition metal nitride layer can be formed by sputtering a transition metal target (e.g., a single transition metal, more than one transition metal such as an alloy of two or more transition metals, or a transition metal compound (e.g., transition metal aluminide or silicide) in nitrogen gas. Though the target could be a combination of more than one transition metal (or two transition metals in alloy form), in one example the target includes a single transition metal, or one transition metal (or more than one transition metal) and one or more metalloids (and, optionally, minute quantities of impurities such as O, H, other transition metals, metalloids, and so forth, which are typically present in various sputtering methods). In one embodiment, the target includes at least one transition metal and at least one metalloid. In another embodiment, the target includes a single transition metal without any other metals except as impurities or in trace amounts. In such a case, the transition metal of the target can make up 90% or more of the target, such as 98% or more. And, though nitrogen and argon can be used as gases for reactive sputtering (e.g. 20% $N_2$, 80% Ar), small amounts of oxygen or hydrogen (or compounds thereof such as a transition metal oxide in small amounts) can be present in the layer or structure being formed (the oxygen and/or hydrogen in the layer derived from target "impurities" or from the sputtering gas).

Figure 2:
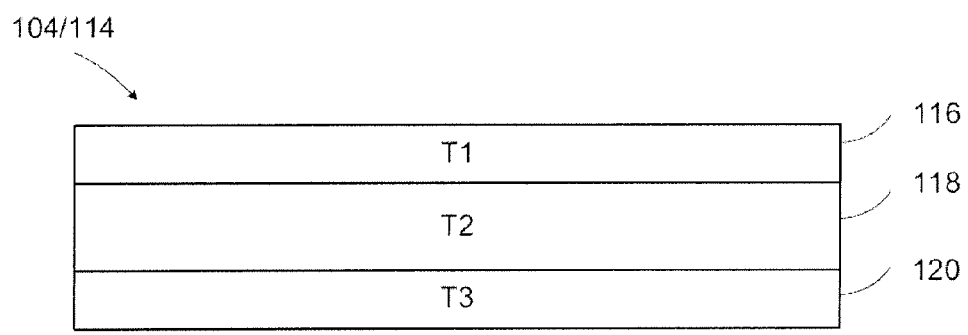
FIG. 2 diagrammatically illustrates an embodiment of a thermal layer used in the thermally-assisted magnetic tunnel junction structure in FIG. 1.

Either one, or both, of the thermal barrier layers 104 and 114 can include multiple layers, an example of which is diagrammatically illustrated in FIG. 2. Referring to FIG. 2, the barrier layer 104 or 114 in FIG. 1 is a laminate that includes an intermediate layer 118 that can include a transition nitride or oxide material layer with a thickness of from about 1 to about 100 nanometers, such as around about 20 nanometers. As an optional feature, adhesion layers 116 and 120 can be deposited on the top and bottom surfaces of the intermediate layer 118 to enhance the adhesion of the intermediate layer 118 to other device layers, such as to the free magnetic layer 106, the fixed magnetic layer 110, and/or the buffer layer 112. One example of materials for the adhesion layers 116 and 120 can be $TiWN_2$.

Referring again to FIG. 1, the top and the bottom electrode layers 102a and 102b provide electrical contacts (electrodes), for example, to external signal/power sources. Accordingly, the electrode layers 102a and 102b each include an electrically conductive material, such as metallic elements, metallic alloys, metallic compounds, inter-metallic compounds, and any combinations thereof. Each electrode layer can be a laminate including multiple layers of different materials. The intermetallic compound may be composed of an early transition metal or a late transition metal. In one example, the electrode layers 102a and 102b may include NiFe, CoFe, CoNiFe, CoFeB, PtMn, Ru, IrMn, or other suitable materials. In another example, the electrode layers 102a and 102b may be composed of Ti, Ta, or a laminate of Ti and Ta.

Figure 3:
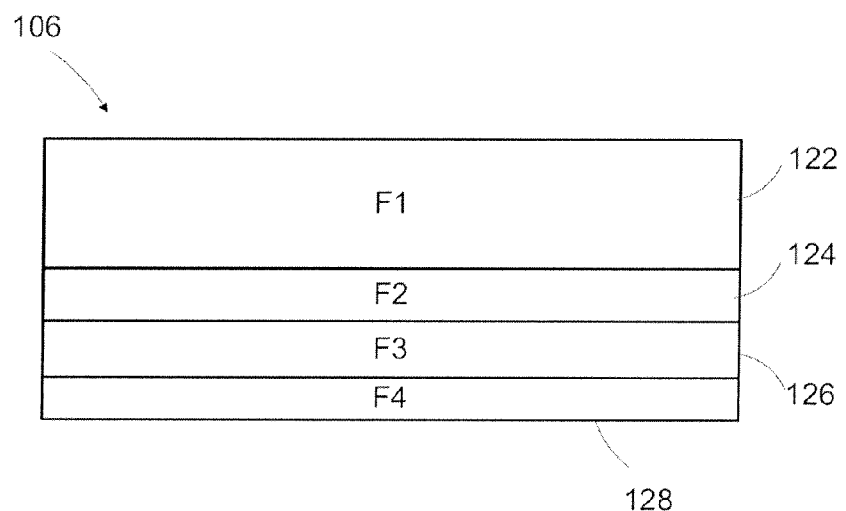
FIG. 3 diagrammatically illustrates an embodiment of a free magnetic layer used in the thermally-assisted magnetic tunnel junction structure in FIG. 1.

The free magnetic layer 106 includes a magnetic material. In one example, the free magnetic layer 106 has a low blocking temperature, such as a blocking temperature of about 200° C. or lower, or around about 150° C. The free magnetic layer 106 may be composed of multiple layers, such as a pining layer 122 that may include IrMn or other chemical species, a layer 124 that may include NiFe or other materials, and a layer 126 that may include CoFeB or other materials as diagrammatically illustrated in FIG. 3. As an optional feature, a Ta decoupling layer 128 can be included in the free magnetic layer stack so as to decouple the correlation between the dielectric layer (the tunnel junction layer 108 in FIG. 1) and the IrMn pining layer 122. The Ta layer 128 can be disposed at any location between the IrMn pinning layer 122 and the tunnel junction layer 108. For example, the Ta layer 128 can be disposed between the NiFe and CoFeB layers 124 and 126, or between the IrMn and NiFe layers 122 and 124.

The dielectric layer (tunnel junction layer 108) is the magnetic-tunnel-junction layer. The dielectric layer 108 may include various dielectric materials, such as oxides, nitrides, carbides, oxy-nitrides, carbon-oxy-nitrides, and other suitable materials and any combinations thereof. The dielectric layer 108 can be a separate thin-film layer formed, for example, by thin-film deposition followed by patterning. Alternatively, the dielectric layer 108 can be formed by chemical reaction of another device component. For example, a metallic layer composed of a metallic element, such as Mg or Al, can be deposited. The deposited metallic layer can be oxidized or nitridized so as to form the desired dielectric layer 108.

Figure 4:
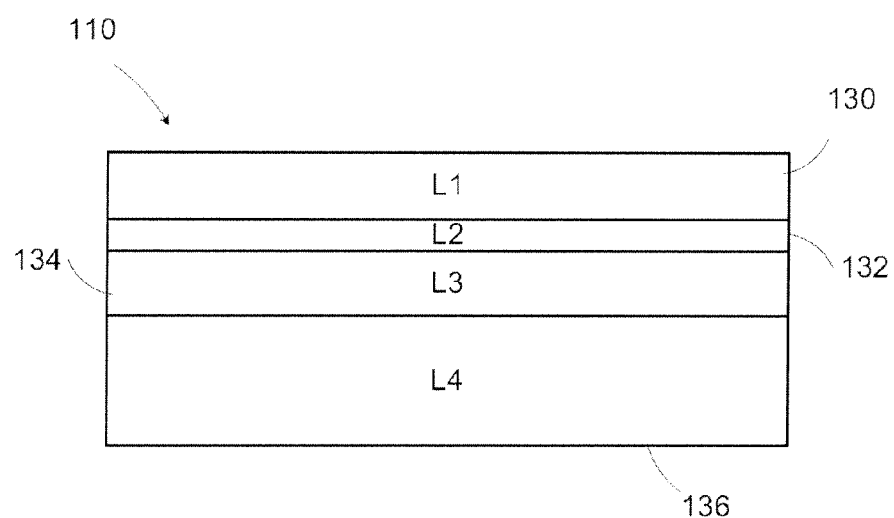
FIG. 4 diagrammatically illustrates an embodiment of a fixed magnetic layer used in the thermally-assisted magnetic tunnel junction structure in FIG. 1.

The fixed magnetic layer 110 includes a magnetic material, such as a ferromagnetic, anti-ferromagnetic, and/or permanent magnetic material. Regardless of different materials used, it is desirable (though not required) that the fixed magnetic layer 110 has a higher blocking temperature than the free magnetic layer 106, such as a blocking temperature of about 200° C. or higher and below about 500° C., or around about 325° C. The fixed magnetic layer 110 may alternatively be comprised of multiple thin-film components, an example of which is diagrammatically illustrated in FIG. 4. Referring to FIG. 4, the fixed magnetic layer 110 in this example includes a layer 130 that may include CoFeB or other materials, a layer 132 that may include Ru or other materials, a layer 134 that may include CoFe or other materials, and a pining layer 136 that may include PtMn or other materials.

Referring back to FIG. 1, the buffer layer 112 can be provided as an optional feature. An example of the buffer layer 112 can be a Ta layer.

The thermally-assisted magnetic tunnel junction structure 100 as discussed above can be configured as various electronic devices, such as signal storage devices (e.g., magnetic random access memories), magnetic writing/reading heads, and sensors. In digital storage applications, a bit value can be written to or read out from the magnetic tunnel junction structure 100 by the top and bottom electrodes 102a and 102b. Typically, a number of magnetic tunnel junction structures are arranged as a memory array for storing digital values.

In an embodiment not illustrated, a memory system includes a memory array with a plurality of the thermally assisted magnetic tunnel junction structures disclosed herein. The memory system can further include one or a plurality of current lines connecting the plurality of magnetic tunnel junction structures, for example, along a row and/or a column, in order to pass an electrical current heating the thermal barriers 104 and 114.

A practitioner of ordinary skill in the art requires no additional explanation in developing the embodiments described herein but may nevertheless find some helpful guidance by examining the following references: U.S. patent application US2007/0263434 to Dieny et al., published Nov. 15, 2007, and U.S. Pat. No. 7,411,817 to Nozières et al., issued Aug. 12, 2008, the disclosures of which are incorporated herein by reference in their entirety for all purposes.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A thermally-assisted magnetic tunnel junction structure, comprising:
   a magnetic tunnel junction; and
   a thermal barrier coupled to the magnetic tunnel junction, wherein the thermal barrier comprises a cermet material that comprises a ceramic component and a metallic component, the metallic component having a long range order that is no greater than 100 angstroms in the thermal barrier.

2. The thermally-assisted magnetic tunnel junction structure of claim 1, wherein the magnetic tunnel junction comprises a free magnetic layer, a fixed magnetic layer, and a magnetic tunnel junction layer positioned between the free magnetic layer and the fixed magnetic layer, and the thermal barrier is attached to a major surface of the free magnetic layer of the magnetic tunnel junction.

3. The thermally-assisted magnetic tunnel junction structure of claim 1, wherein the metallic component of the cermet has a long range order that is no greater than 200 angstroms.

4. The thermally-assisted magnetic tunnel junction structure of claim 1, wherein the cermet material has a long range order that is no greater than 80 angstroms.

5. The thermally-assisted magnetic tunnel junction structure of claim 1, wherein the thermal barrier has a thermal conductivity no greater than 2 W/mK.

6. The thermally-assisted magnetic tunnel junction structure of claim 1, wherein the thermal barrier has an electric conductivity in the range of $1 \times 10^4$ S/m to $60 \times 10^4$ S/m at a temperature of 20° C.

7. The thermally-assisted magnetic tunnel junction structure of claim 1, wherein the cermet material comprises a matrix base material with another material interspersed within or at a surface of the matrix base material.

8. A thermally-assisted magnetic random access memory structure, comprising:
   a magnetic tunnel junction comprising a free magnetic layer, a fixed magnetic layer, and a tunnel junction layer positioned between the free magnetic layer and the fixed magnetic layer; and
   a thermal barrier comprising a cermet material, and pinning the free magnetic layer below a temperature threshold and acting as a paramagnet at and above the temperature threshold when the thermal barrier is heated.

9. The thermally-assisted magnetic tunnel junction structure of claim 8, wherein the cermet comprises a binary compound of a transition metal and nitrogen.

10. The thermally-assisted magnetic tunnel junction structure of claim 8, wherein the cermet comprises a binary compound being comprised of one of $SiO_x$, $BO_x$, $PO_x$, and $AlO_x$.

11. The thermally-assisted magnetic tunnel junction structure of claim 8, wherein the cermet comprises a ternary material X—Y—Z, where X is a transition metal; Y is one of Si, Al, and B; and Z is one of nitride, O—N, C—N, and P—N.

12. The thermally-assisted magnetic tunnel junction structure of claim 8, wherein the cermet material comprises a composite of a transition metal and one of a nitride, oxynitride, and carbonitride.

13. A magnetic random access memory device, comprising:
   a magnetic tunnel junction comprising a fixed magnetic layer, a free magnetic layer, and a magnetic tunnel junction layer; and
   a thermal barrier adjacent to the magnetic tunnel junction and comprising a varistor having a non-linear current-voltage property.

14. The magnetic random access memory device of claim 13, wherein the varistor comprises a cermet.

15. The magnetic random access memory device of claim 14, wherein the thermal barrier comprises a material having the formula $X_a Y_b Z_c$, wherein X is a transition metal, Y is selected from one of Group IIIA and Group IVA, and Z is selected from one of Group VA and Group VIA.

16. The magnetic random access memory device of claim 14, wherein Y is one of Si, B, Al, and Ge.

17. The magnetic random access memory device of claim 14, wherein Z is one of N and O.

18. The magnetic random access memory device of claim 14, wherein X is one of Ir, Ru, Re, Pd, Pt, Rh, Co, and Ti.

19. The magnetic random access memory device of claim 14, wherein X is one of an early transition metal and a late transition metal.

20. The magnetic random access memory device of claim 14, wherein the thermal barrier comprises at least one of CoSiN and TiSiN.

21. The magnetic random access memory device of claim 14, wherein the thermal barrier comprises an early transition metal nitride.

22. The magnetic random access memory device of claim 14, the thermal barrier comprises an electrically conductive metal oxide and another chemical element.

23. The magnetic random access memory device of claim 22, wherein the another chemical element is one of Si and O.

24. The magnetic random access memory device of claim 14, wherein the thermal barrier comprises an oxynitride material.

25. The magnetic random access memory device of claim 14, wherein the thermal barrier has a thermal conductivity no greater than 3 W/mK and an electric resistivity of at least 200 µΩ-cm at a temperature of 20° C.

26. The magnetic random access memory device of claim 25, wherein the thermal barrier has a thermal conductivity no greater than 2 W/mK at a temperature of 20° C.

27. The magnetic random access memory device of claim 14, wherein the thermal barrier has an electric resistivity of at least 1000 µΩ-cm at a temperature of 20° C.

28. A thermally-assisted magnetic tunnel junction structure, comprising:
   a magnetic tunnel junction; and
   a thermal barrier coupled to the magnetic tunnel junction, wherein the thermal barrier has a thermal conductivity no greater than 3 W/mK and an electric resistivity of at least 200 µΩ-cm at a temperature of 20° C.

29. The thermally-assisted magnetic tunnel junction structure of claim 28, wherein the thermal barrier has a thermal conductivity no greater than 2 W/mK at a temperature of 20° C.

30. The thermally-assisted magnetic tunnel junction structure of claim 28, wherein the thermal barrier has an electric resistivity of at least 1000 µΩ-cm at a temperature of 20° C.

31. The thermally-assisted magnetic tunnel junction structure of claim 28, wherein the thermal barrier has a long range order that is no greater than 100 angstroms in the thermal barrier.

32. The thermally-assisted magnetic tunnel junction structure of claim 31, wherein the thermal barrier comprises a metallic material and a dielectric material, and wherein the metallic material has a long range order no greater than 100 angstroms in the thermal barrier.

33. The thermally-assisted magnetic tunnel junction structure of claim 32, wherein the metallic material has a long range order no greater than 80 angstroms.

34. A thermally-assisted magnetic tunnel junction structure, comprising:
   a magnetic tunnel junction; and
   a thermal barrier coupled to the magnetic tunnel junction, wherein the thermal barrier has a negative thermal coefficient of resistivity.

35. The thermally-assisted magnetic tunnel junction structure of claim 34, wherein the thermal barrier has a thermal conductivity no greater than 3 W/mK and an electric resistivity of at least 200 µΩ-cm at a temperature of 20° C.

36. The thermally-assisted magnetic tunnel junction structure of claim 35, wherein the thermal barrier has a thermal conductivity no greater than 2 W/mK at a temperature of 20° C.

37. The thermally-assisted magnetic tunnel junction structure of claim 35, wherein the thermal barrier has an electric resistivity of at least 1000 µΩ-cm at a temperature of 20° C.

38. The thermally-assisted magnetic tunnel junction structure of claim 35, wherein the thermal barrier comprises a varistor.

39. The thermally-assisted magnetic tunnel junction structure of claim 35, wherein the thermal barrier comprises a cermet.

* * * * *